(12) United States Patent
Zeng et al.

(10) Patent No.: US 11,502,231 B2
(45) Date of Patent: Nov. 15, 2022

(54) LIGHT-EMITTING DIODE DEVICE, LED LAMP AND METHOD FOR MACHINING CONDUCTIVE WIRE OF LED DEVICE

(71) Applicant: FOSHAN NATIONSTAR OPTOELECTRONICS CO., LTD, Guangdong (CN)

(72) Inventors: Ziheng Zeng, Guangdong (CN); Zhiguo Xie, Guangdong (CN); Fuhai Li, Guangdong (CN); Libing Pan, Guangdong (CN)

(73) Assignee: FOSHAN NATIONSTAR OPTOELECTRONICS CO., LTD, Guangdong (CN)

( * ) Notice: Subject to any disclaimer, the term of this patent is extended or adjusted under 35 U.S.C. 154(b) by 145 days.

(21) Appl. No.: 16/766,716

(22) PCT Filed: Aug. 28, 2018

(86) PCT No.: PCT/CN2018/102705
§ 371 (c)(1),
(2) Date: Sep. 9, 2020

(87) PCT Pub. No.: WO2019/105075
PCT Pub. Date: Jun. 6, 2019

(65) Prior Publication Data
US 2021/0013386 A1    Jan. 14, 2021

(30) Foreign Application Priority Data

Nov. 28, 2017 (CN) .......................... 201711214755.1
Nov. 28, 2017 (CN) .......................... 201721624165.1

(51) Int. Cl.
*H01L 33/62* (2010.01)
*H01L 25/075* (2006.01)
(Continued)

(52) U.S. Cl.
CPC .......... *H01L 33/62* (2013.01); *H01L 25/0753* (2013.01); *H01L 33/483* (2013.01); *H01L 33/54* (2013.01)

(58) Field of Classification Search
CPC ..... H01L 33/483; H01L 33/486; H01L 33/54; H01L 33/62; H01L 25/075;
(Continued)

(56) References Cited

U.S. PATENT DOCUMENTS 8,525,352 B2 * 9/2013 Har ........................ H01L 24/85
257/784
2005/0093146 A1 5/2005 Corp et al.
(Continued)

FOREIGN PATENT DOCUMENTS

| CN | 106784242 A | 5/2017 |
| CN | 206271702 U | 6/2017 |

(Continued)

*Primary Examiner* — Raj R Gupta
(74) *Attorney, Agent, or Firm* — Gang Yu

(57) ABSTRACT

Some embodiments of the disclosure provide an LED device, an LED lamp and a method for machining a conductive wire of an LED device. The Light-Emitting Diode (LED) device includes at least one LED chip, a bracket and at least one conductive wire. Each of the at least one conductive wire is of a three-dimensional structure and includes a vertical section, first stress cushioning section inclined obliquely upwards, second stress cushioning section inclined obliquely downwards and third stress cushioning section inclined obliquely downwards that are sequentially arranged. A first transition bending section, a second transition bending section and a third transition bending section are sequentially formed between the vertical section, the first stress cushioning section.

15 Claims, 6 Drawing Sheets

(51) Int. Cl.
*H01L 33/48* (2010.01)
*H01L 33/54* (2010.01)

(58) Field of Classification Search
CPC . H01L 25/0753; H01L 25/167; H01L 27/153; H01L 27/156; H01L 2224/48095; H01L 2224/48096; H01L 2224/48097
See application file for complete search history.

(56) References Cited

U.S. PATENT DOCUMENTS

| | | | | |
|---|---|---|---|---|
| 2010/0090330 | A1* | 4/2010 | Nakazato | H01L 24/49 257/784 |
| 2012/0018768 | A1* | 1/2012 | Li | H01L 24/48 257/E33.066 |
| 2019/0096847 | A1* | 3/2019 | Fukamachi | H01L 24/85 |

FOREIGN PATENT DOCUMENTS

| | | |
|---|---|---|
| CN | 206388703 U | 8/2017 |
| CN | 107978668 A | 5/2018 |
| CN | 207529972 U | 6/2018 |

* cited by examiner

LIGHT-EMITTING DIODE DEVICE, LED LAMP AND METHOD FOR MACHINING CONDUCTIVE WIRE OF LED DEVICE

CROSS INTERFERENCE TO RELATED APPLICATIONS

The present disclosure claims priority to Chinese Patent Application No. 201711214755.1, filed on Nov. 28, 2017, and entitled LED Device, LED Lamp and Method for Machining Conductive Wire of LED device; and the present disclosure claims priority to Chinese Patent Application No. 201721624165.1, filed on Nov. 28, 2017, and entitled LED Device and LED Lamp.

TECHNICAL FIELD

The present disclosure relates to a technical field of semiconductors, and particularly to an LED device, an LED lamp and a method for machining a conductive wire of an LED device.

BACKGROUND

In an art known to inventors, a chip of an LED device is mounted through a bracket, two spaced electric connection regions are arranged on the bracket, and an insulating region is between the two electric connection regions. The LED chip is mounted in one electric connection region of the two spaced electric connection regions and is electrically connected with the other electric connection region of the two spaced electric connection regions through a conductive wire, thereby turning on the LED chip. After the conductive wire is mounted, it is necessary to cover the bracket with a packaging colloid to cover the LED chip and the conductive wire therein through the packaging colloid.

In the art known to inventors, a conductive wire is usually of a two-dimensional structure, namely the conductive wire is in the same plane. For example, Chinese Patent Application CN204204914U disclosed a gold wire of a two-dimensional structure, entitled "LED Packaging Structure". However, the conductive wire of the two-dimensional structure only cushions a stress on the two-dimensional plane where it is and do not cushion a stress on the conductive wire in another direction.

For further improving a stress cushioning capability of a conductive wire, a conductive wire of another structure is disclosed in the art known to inventors. Specifically, referring to Chinese Patent Application CN106784242A, entitled "LED Device, LED Lamp and Method for Machining Conductive Bonding Wire of LED Device", the conductive bonding wire disclosed therein includes a vertical section, first bent section, second bent section and connecting section that are sequentially connected. The first bent section and the second bent section form a three-dimensional structure, so that the stress cushioning capability of the conductive bonding wire is improved. However, the conductive bonding wire of this structure has the following shortcomings.

For improving the stress cushioning capability of the conductive bonding wire, an overall camber height of the conductive bonding wire is required to be controlled. When the camber height is greater, a range of a packaging colloid related to the conductive bonding wire is larger, the conductive bonding wire is affected more by thermal expansion and contraction of the packaging colloid, and meanwhile, a tensioning range of the conductive bonding wire is larger, so that the camber height of the conductive bonding wire is required to be controlled.

Chinese Patent Application CN106784242A is formed by bending a top end of the gold wire in Chinese Patent Application CN204204914U to one side. An angle by which the top end is bent to one side is called a J angle. Herein, the J angle determines a height C2 of the conductive bonding wire and an included angle B1 formed by the first bent section and the second bent section in the horizontal plane (referring to FIG. 1 to FIG. 2). This is because, when a amplitude of bending the conductive bonding wire to one side is increased, namely the J angle is enlarged, the camber height C2 is reduced, and the included angle B1 is reduced. There are two methods for reducing the camber height C2. The first method is to reduce a height C1 (i.e., a height from an electrode of an LED chip to a first bending point of a wire camber) of the vertical section of the conductive bonding wire under the condition of ensuring the included angle B1 and an outward bending degree of the wire camber. When the height C1 of the vertical section is less than a length of a Heat Affected Zone (HAZ) of the bonding wire, a junction D of the vertical section and a solder ball becomes weak, the reliability thereof is reduced to a certain extent, and it is unlikely to meet a requirement. The second method is to enlarge the J angle. However, when the J angle is enlarged, the included angle B1 of the wire camber is reduced. In addition, when a outward bending degree of the wire camber is increased, a top end of the wire camber is lowered, and in such case, a condition that C2≤C1 is occur, namely a burden of the junction D of the vertical section and the solder ball is increased, resulting in reduction of the reliability.

Similarly, if a conductive bonding wire for connecting two LED chips and a conductive bonding wire for connecting an LED chip and an electric connection region where the LED chip is located also adopt the abovementioned J wire camber, the abovementioned problems also exist. For example, Chinese Patent Application CN206388703 disclosed that a top end of a conductive bonding wire is bent to one side, a bending angle determines a height of the conductive bonding wire and an included angle formed by a first bent section and a second bent section, and there is a high probability that a height of a vertical section is less than a length of a HAZ of the bonding wire in a process of reducing a camber height.

SUMMARY

Some embodiments of the present disclosure provide a Light-Emitting Diode (LED) device, to improve a stress cushioning capability of a conductive wire of the LED device.

In order to achieve the purpose, some embodiments of the present disclosure provide an LED device, which includes at least one LED chip, a bracket configured to bear the at least one LED chip and at least one conductive wire electrically connected with at least one LED chip, wherein each of the at least one conductive wire is of a three-dimensional structure and includes a vertical section and bent section that are sequentially arranged, the bent section may include at least three stress cushioning sections that are sequentially arranged, transition bending sections are formed between adjacent stress cushioning sections in the at least three stress cushioning sections, and bending directions of adjacent transition bending sections in the transition bending sections are opposite; and one end of the each of the at least one conductive wire is configured to connect one LED chip of the at least one light-emitting diode chip, and the other end of the each of the at least one conductive wire is configured to connect the bracket or another LED chip of the at least one light-emitting diode chip.

In an exemplary embodiment, the bracket includes a plurality of electric connection regions, any two adjacent electric connection regions in the plurality of electric connection regions are spaced through an insulating region, the at least one LED chip is disposed in the plurality of electric connection regions, the vertical section of the each of the at least one conductive wire is electrically connected with an LED chip of the at least one light-emitting diode chip in one electric connection region of the plurality of electric connection regions, and one end, opposite to the vertical section, of the each of the at least one conductive wire is electrically connected with another LED chip of the at least one light-emitting diode chip in a same electric connection region, an LED chip of the at least one light-emitting diode chip in an adjacent electric connection region, a same electric connection region or an adjacent electric connection region.

In an exemplary embodiment, the bent section includes a first stress cushioning section, second stress cushioning section and third stress cushioning section that are sequentially arranged, a first transition bending section may be formed between the vertical section and the first stress cushioning section, a second transition bending section is formed between the first stress cushioning section and the second stress cushioning section, a third transition bending section is formed between the second stress cushioning section and the third stress cushioning section, and the first transition bending section, the second transition bending section and the third transition bending section is sequentially disposed along a length direction of a corresponding conductive wire of the at least one conductive wire.

In an exemplary embodiment, the first transition bending section, the second transition bending section and the third transition bending section are positioned on a same side of an insulating region.

In an exemplary embodiment, the first stress cushioning section and the second stress cushioning section are positioned over the LED chip where the vertical section is located.

In an exemplary embodiment, the vertical section is electrically connected with the LED chip of the at least one light-emitting diode chip, the LED chip is a double-electrode chip, and when a vertical mounting manner is adopted for the double-electrode chip, the vertical section is connected with one electrode in a positive electrode or negative electrode of the double-electrode chip and the first stress cushioning section is inclined towards the other electrode in the positive electrode or negative electrode in the positive electrode and the negative electrode of the double-electrode chip.

In an exemplary embodiment, the first stress cushioning section is inclined obliquely upwards, and the second stress cushioning section and the third stress cushioning section are inclined obliquely downwards.

In an exemplary embodiment, the third stress cushioning section and the vertical section are positioned on the same plane.

In an exemplary embodiment, the each of the at least one conductive wire further includes a transition connecting section disposed at a tail end of the third stress cushioning section, an included angle between the transition connecting section and a horizontal plane is smaller than an included angle between the third stress cushioning section and a horizontal plane, and an end portion, far away from the third stress cushioning section, of the transition connecting section is attached to a surface of the bracket or a surface of the another LED chip.

In an exemplary embodiment, the included angle between the transition connecting section and the horizontal plane may be A0, $0°≤A0≤10°$.

In an exemplary embodiment, a height of the vertical section is H1, $30\ \mu m≤H1≤50\ \mu m$, and a height difference between a highest point of the each of the at least one conductive wire and an upper surface of the LED chip connected with one end of the each of the at least one conductive wire is H2, $50\ \mu m<H2≤70\ \mu m$.

In an exemplary embodiment, a length of a projection of the first stress cushioning section on the horizontal plane is L1, $80\ \mu m≤L1≤120\ \mu m$, and an included angle between the first stress cushioning section and the horizontal plane is A1, $0°<A1≤20°$.

In an exemplary embodiment, a length of a projection of the second stress cushioning section on the horizontal plane is L2, $80\ \mu m≤L2≤120\ \mu m$, an included angle between the second stress cushioning section and a horizontal plane is A2, $0°<A2≤20°$, and a vertical height of the second stress cushioning section is H3, $0\ \mu m<H3≤60\ \mu m$.

In an exemplary embodiment, an included angle between the projections of the first stress cushioning section and the second stress cushioning section on a horizontal plane is A3, $60°≤A3≤90°$, and an included angle between projections of the second stress cushioning section and a third stress cushioning section on a horizontal plane is A4, $120°≤A4≤135°$.

Some embodiments of the present disclosure provide an LED lamp, which includes the abovementioned LED device.

Some embodiments of the present disclosure provide a method for machining a conductive wire of the abovementioned LED device, which include the following steps: A, after a gold ball is welded to a corresponding electrode of an LED chip in the at least one light-emitting diode chip, a welding head of the gold ball is moved upwards and a wire clamp is unreeled, thereby forming a vertical section; B, the welding head is moved along a set trajectory, thereby forming a first bent section, the first bent section being a first stress cushioning section and a first transition bending section being formed between the first stress cushioning section and the vertical section; and C, the welding head is moved along the set trajectory, thereby forming a second bent section, a second transition bending section being formed between the second bent section and the first bent section, and in a process of forming the second bent section, the welding head is pressed downwards, thereby forming a third transition bending section, a second stress cushioning section and a third stress cushioning section being on two sides of the third transition bending section respectively.

Some embodiments of the present disclosure provide a method for machining a conductive wire of the abovementioned LED device, which includes the following steps: A, after a gold ball is welded to a corresponding electrode of an LED chip, a welding head is moved upwards and a wire clamp is unreeled, thereby forming a vertical section; and B, the welding head is moved along a set trajectory, thereby forming a bent section, the bent section including at least three stress cushioning sections that are sequentially arranged, a transition bending section being formed between the vertical section and a stress cushioning section disposed in sequence with of the vertical section and the transition bending sections being formed between any adjacent stress cushioning sections in the at least three stress cushioning sections.

Implementing the embodiments of the present disclosure has the following beneficial effects.

1: For the conductive wire in some embodiments of the present disclosure, the step that the welding head is pressed downwards is added based on a J wire camber, namely a new bending point is formed on the second bent section of the J wire camber. In such case, dependence of a camber height of the conductive wire on a J angle is reduced, a shorter first bent section is formed, the camber height in some embodiments of the present disclosure changes less than the J wire camber when the J angle changes, and it is ensured that the height of the vertical section is greater than a length of a Heat Affected Zone (HAZ) of the wire at the same time of reducing the camber height.

2: The first stress cushioning section, second stress cushioning section and third stress cushioning section of the conductive wire of some embodiments in the present disclosure form a three-dimensional structure, so that a stress in each direction is cushioned. In some embodiments of the present disclosure, the third transition bending section is disposed, so that a stress cushioning capability of the conductive wire is improved to a certain extent, namely reliability of the conductive wire is improved.

3: When the conductive wire of some embodiments in the present disclosure is adopted, the height of the wire camber is reduced to be less than 70 μm, so that influence of a thermal expansion stress of a packaging colloid on the wire camber is reduced.

4: Accuracy of controlling the camber height of the conductive wire of some embodiments in the present disclosure is higher. Reasons are as follows.

a: Since the camber height of some embodiments of the present disclosure is relatively small, when the conductive wire is bent to one side by the same angle, a camber height of the J wire camber changes more than the camber height in some embodiments of the present disclosure, namely, when a certain camber height is required to be reduced, the J wire camber in the art known to inventors is required to be regulated by a smaller angle. It can be seen that the conductive wire of some embodiments in the present disclosure is easier to regulate. For example, under the same condition, a camber length of the J wire camber of the art known to inventors is 100 μm to 350 μm, while a camber length of the conductive wire of some embodiments in the present disclosure is controlled to be 80 μm to 120 μm, and correspondingly, when the included angle between the first stress cushioning section and the horizontal plane changes by 10°, the camber height of the J wire camber of the art known to inventors changes by 17 μm to 61 μm and the camber height of the conductive wire of some embodiments in the present disclosure changes by 14 μm to 21 μm.

In addition, it is to be noted that the camber length of the J wire camber of the art known to inventors should not be too small because a second bending point (a bending point between the first bent section and the second bent section) of the J wire camber gets close to a middle part of a chip if the camber length of the J wire camber is relatively small, namely a second bending point gets far away from an edge of the chip, and reduction of the camber height makes it easy for the second bent section of the wire camber to contact with the chip to short-circuit the chip. The conductive wire of some embodiments in the present disclosure have one more bending point than the J wire camber, so that a last bending point above the chip is closer to the edge of the chip, and the risk that the wire camber contacts with the chip is avoided.

b: A larger J angle is set. Parameter settings of the wire cambers are compared, a set range of the J angle of the J wire camber being ±(30°-60°) and a set range of a J angle of a CJ wire camber being ±(70°-100°), and if the J angle is larger, the height of the wire camber is smaller.

c: After a third bending point is added, since there is made such a design requirement that all the bending points of the wire camber are positioned on one side of the second electric connection region, the length of the first bent section of the wire camber is required to be reduced to reduce the height of the wire camber.

BRIEF DESCRIPTION OF THE DRAWINGS

The drawings forming a part of the present disclosure in the specification are adopted to provide a further understanding to the present disclosure. Schematic embodiments of the present disclosure and descriptions thereof are adopted to explain the present disclosure and not intended to form improper limits to the present disclosure. In the drawings.

DETAILED DESCRIPTION OF THE EMBODIMENTS

The technical solutions in embodiments of the present disclosure will be clearly and completely described below in combination with the drawings in the embodiments of the present disclosure. It is apparent that the described embodiments are only part of the embodiments of the present disclosure but not all of the embodiments. The following description of at least one exemplary embodiment is only illustrative actually, and is not used as any limitation for the present disclosure and the present application or use thereof. All other embodiments obtained by those of ordinary skill in the art based on the embodiments in the present disclosure without creative work shall fall within the scope of protection of the present disclosure.

In order to make the purpose, technical solutions and advantages of the present disclosure clearer, the present disclosure will further be described below in combination with the drawings in detail. It is noted that position terms appearing or about to appear such as upper, lower, left, right, front, rear, inner and outer in the present disclosure are based on the drawings of the present disclosure and do not specifically limit the present disclosure.

Figure 1:
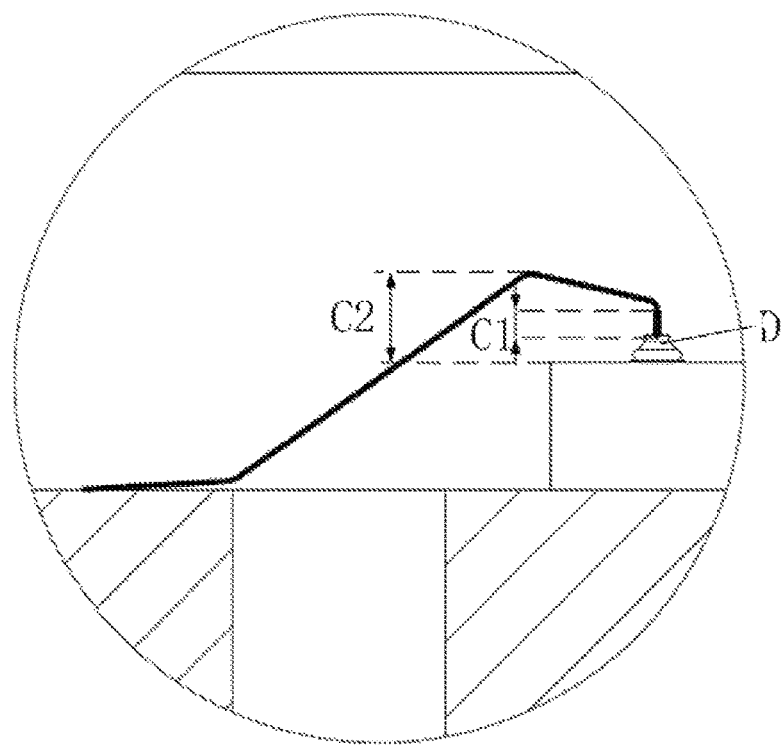
FIG. 1 illustrates a front view of a conductive bonding wire in Chinese Patent Application CN106784242A.
Figure 2:
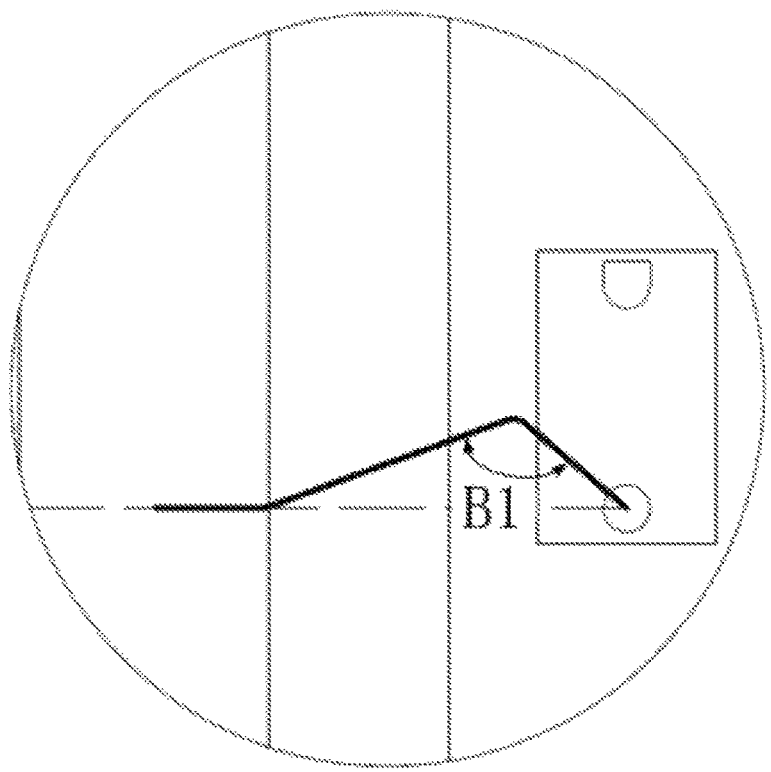
FIG. 2 illustrates a top view of a conductive bonding wire in Chinese Patent Application CN106784242A.
Figure 3:
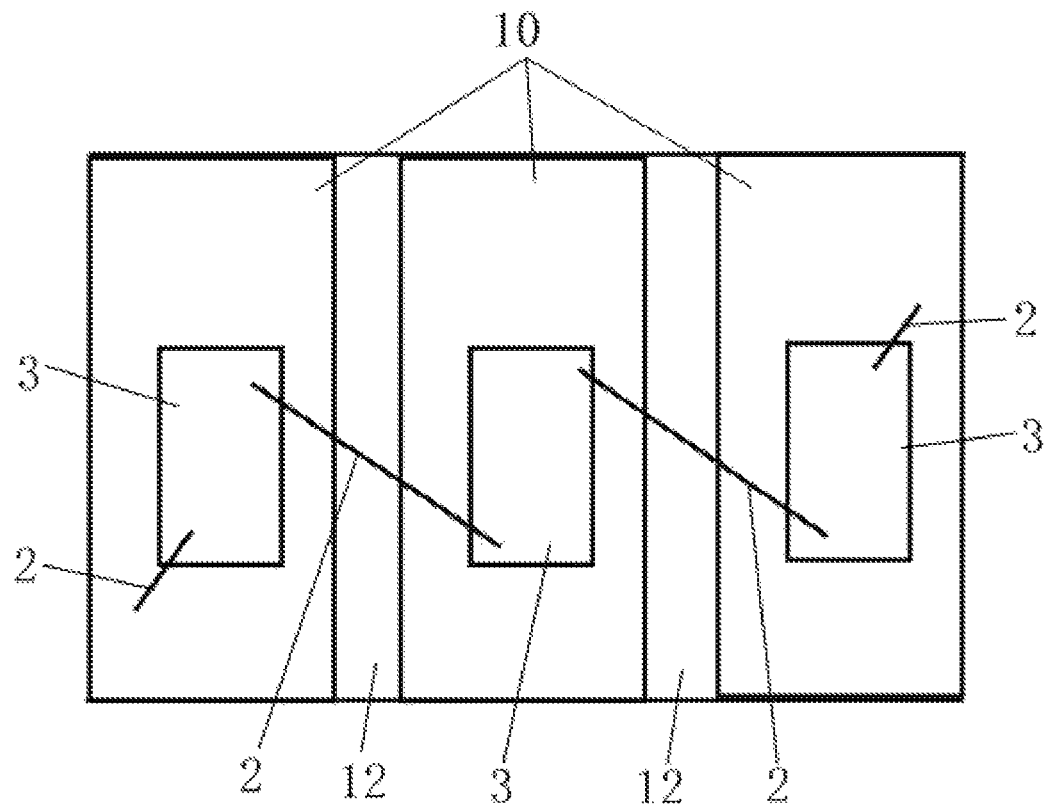
FIG. 3 illustrates a schematic diagram of an LED device according to the present disclosure.

Referring to FIG. 3, some embodiments of the present disclosure provides an Light-Emitting Diode (LED) device, which includes at least one LED chip 3, a bracket 1 configured to bear the at least one LED chip 3 and at least one conductive wire 2 electrically connected with at least one light-emitting diode LED chip 3 of the at least one LED chip. In some embodiments of the present disclosure, one end of the conductive wire is configured to connect the LED chip of the at least one light-emitting diode chip, and the other end of the conductive wire is configured to connect the bracket 1 or another LED chip of the at least one light-emitting diode chip. The LED chip 3 and the conductive wire 2 are covered through a packaging colloid. The conductive wire in FIG. 3 does not represent a top view of the conductive wire but only is an identifier playing a role in connection.

The bracket 1 includes a plurality of electric connection regions 10, any two adjacent electric connection regions 10 in the plurality of electric connection regions are spaced through an insulating region 12, the at least one LED chip 3 is disposed in the plurality of electric connection regions, one end (vertical section mentioned hereinafter) of the each of the at least one conductive wire 2 is electrically connected with the LED chip 3 of the at least one LED chip 3 in one electric connection region 10 of the plurality of electric connection regions, and the other end (specifically referring to the other end opposite to the vertical section) of the each of the at least one conductive wire 2 is electrically connected with another LED chip of the at least one LED chip 3 in a same electric connection region, an LED chip of the at least one LED chip 3 in an adjacent electric connection region, a same electric connection region or a adjacent electric connection region. In some embodiments of the present disclosure, the LED chip is arranged in the electric connection region, and when a plurality of LED chips are arranged, the plurality of LED chips are arranged in a same electric connection region, and in some embodiments of the present disclosure, the plurality of LED chips are separately arranged in different electric connection regions.

Figure 4:
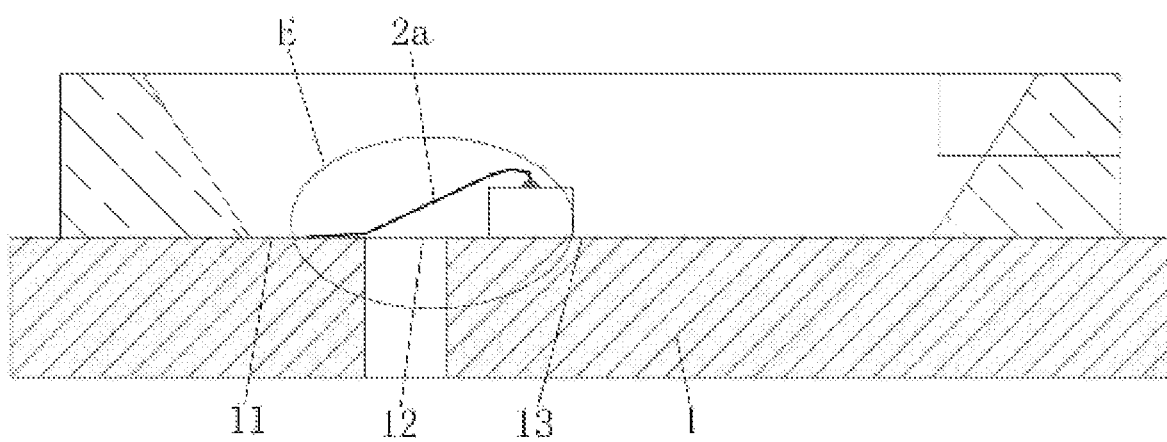
FIG. 4 illustrates a front view of an LED device with two electric connection regions according to the present disclosure.
Figure 5:
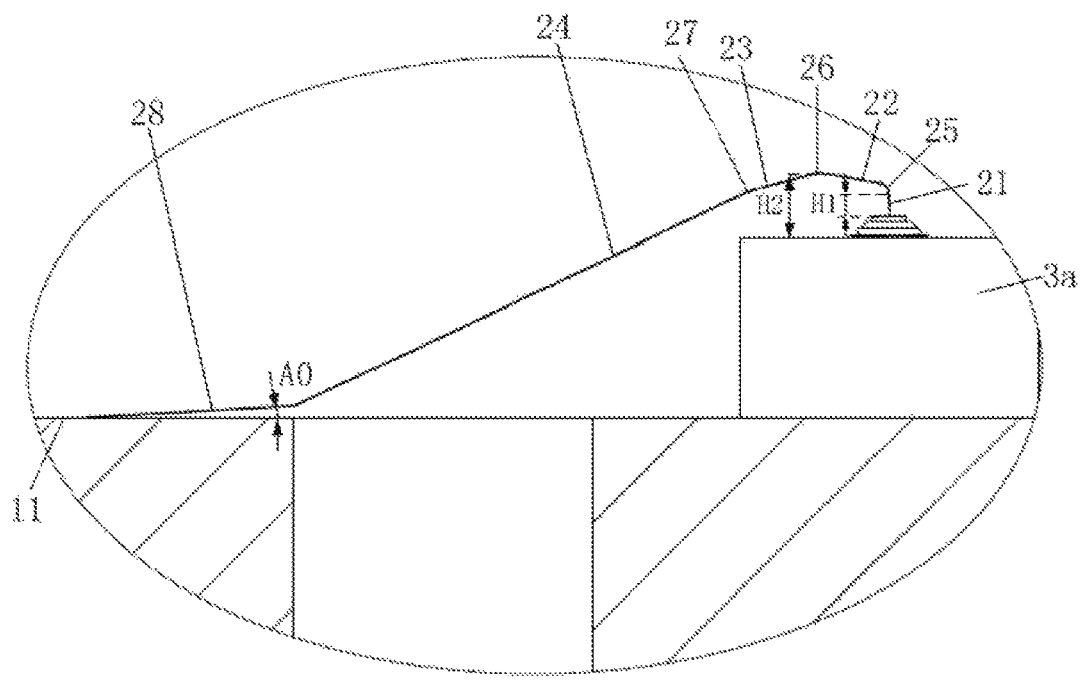
FIG. 5 illustrates a partial enlarged diagram of part E in FIG. 4.
Figure 6:
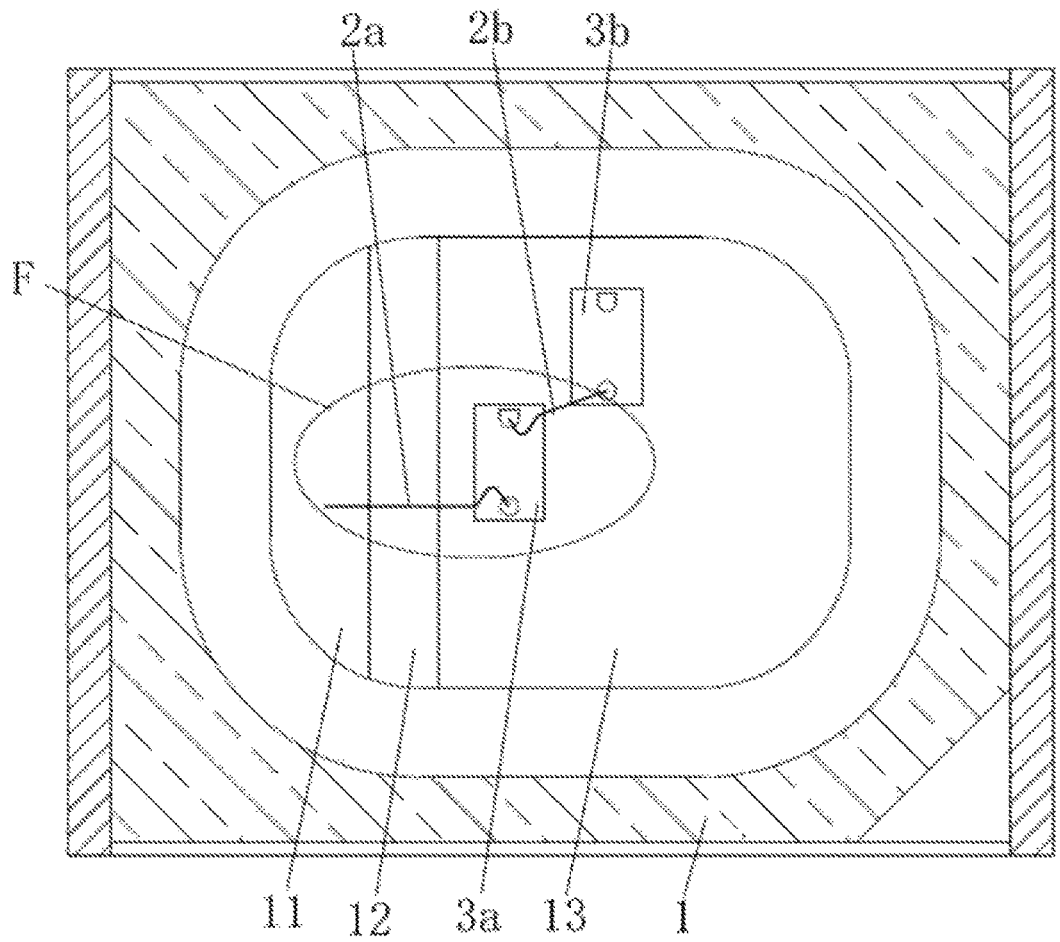
FIG. 6 illustrates a top view of an LED device with two electric connection regions according to the present disclosure.
Figure 7:
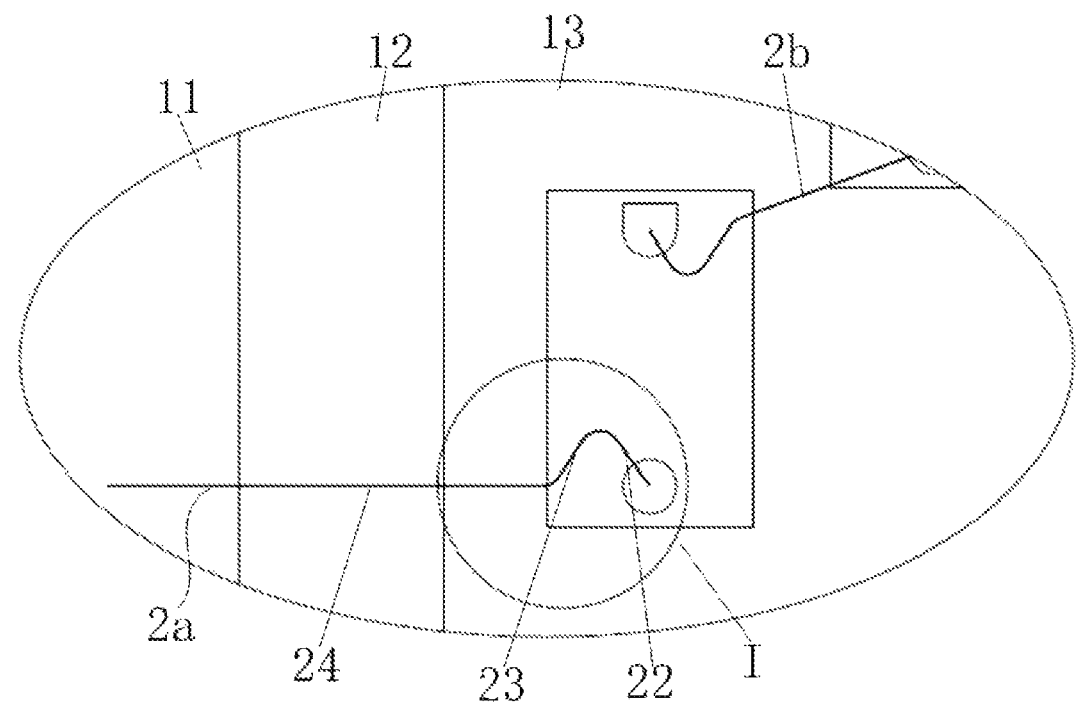
FIG. 7 illustrates a partial enlarged diagram of part F in FIG. 6.
Figure 8:
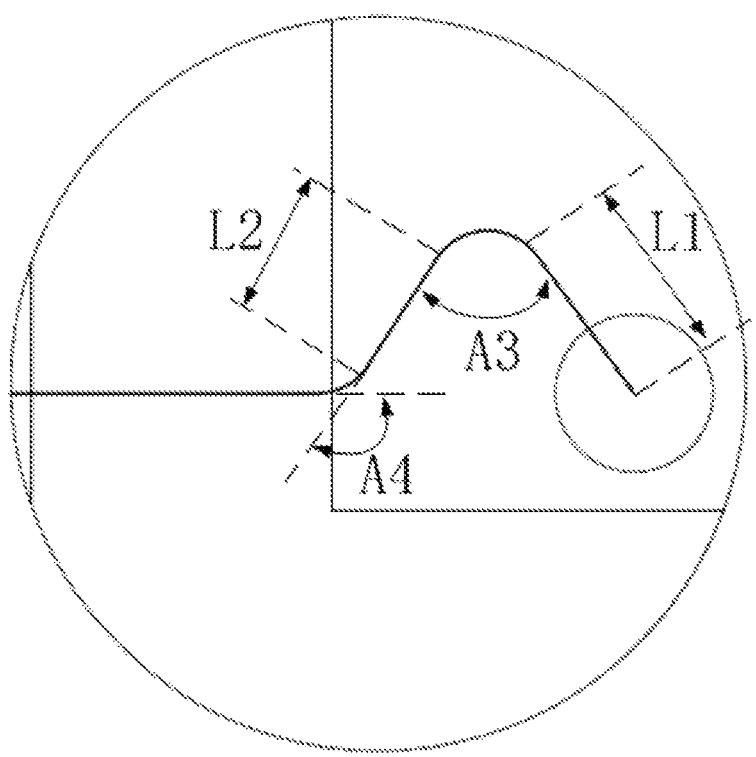
FIG. 8 illustrates a partial enlarged diagram of part I in FIG. 7.
Figure 9:
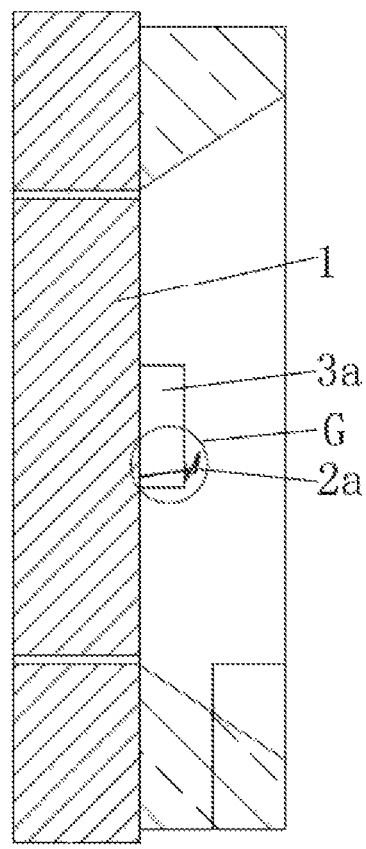
FIG. 9 illustrates a side view of an LED device with two electric connection regions according to the present disclosure.
Figure 10:
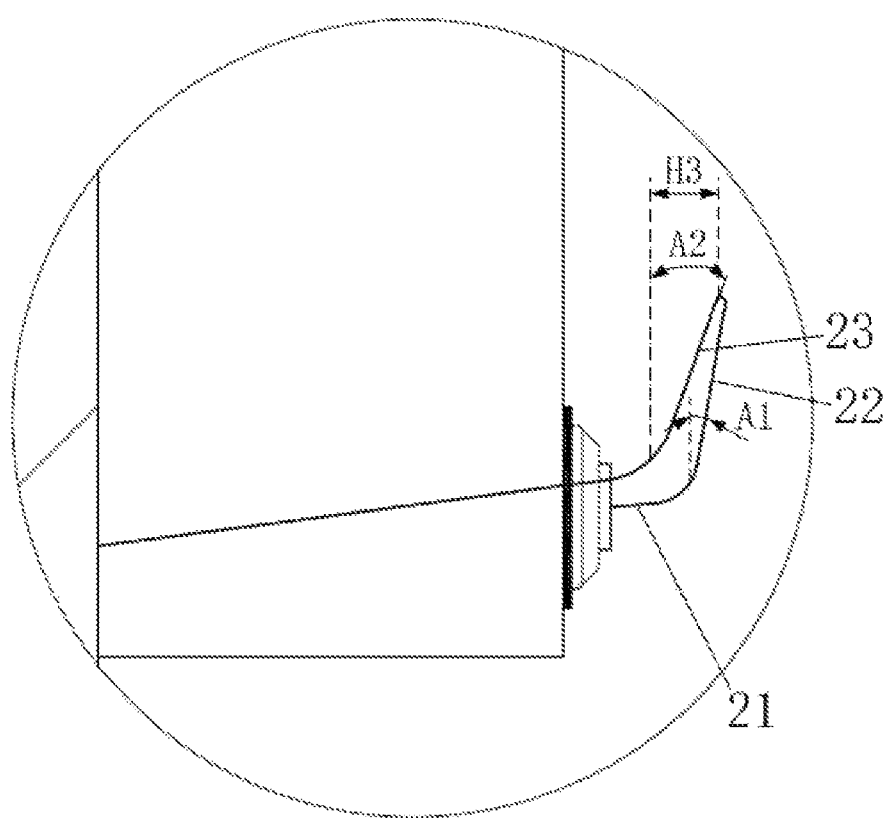
FIG. 10 illustrates a partial enlarged diagram of part G in FIG. 9.

The bracket 1 in FIG. 6 is provided with two electric connection regions, the two electric connection regions are a first electric connection region 11 and a second electric connection region 13 respectively, the insulating region 12 is between the first electric connection region 11 and the second electric connection region 13, and the LED chip is mounted in the second electric connection region 13. There is only one LED chip 3a in the second electric connection region 13 in FIG. 4 and FIG. 8, and there are two LED chips (3a, 3b) in FIG. 6.

It is to be noted that each of the at least one conductive wire (2a, 2b) in some embodiments of the present disclosure is of a three-dimensional structure and includes a vertical section and bent section that are sequentially arranged. The bent section includes at least three stress cushioning sections that are sequentially arranged, transition bending sections are formed between adjacent stress cushioning sections, and bending directions of adjacent transition bending sections are opposite, namely bending directions of the adjacent stress cushioning sections are different. In some embodiments of the present disclosure, there are three stress cushioning sections, i.e., a first stress cushioning section, a second stress cushioning section and a third stress cushioning section respectively, a first stress cushioning section is adjacent to the vertical section, and a third stress cushioning section is a tail end of the bent section. In such case, the bent section is provided with two transition bending sections. Of course, the bent section in some embodiments of the present disclosure also is provided with four stress cushioning sections, etc.

When the bent section is provided with three stress cushioning sections, a first transition bending section is formed between the vertical section and the first stress cushioning section, a second transition bending section is formed between the first stress cushioning section and the second stress cushioning section, a third transition bending section is formed between the second stress cushioning section and the third stress cushioning section, and the first transition bending section, the second transition bending section and the third transition bending section are sequentially arranged along a length direction of the conductive wire. The first stress cushioning section is inclined obliquely upwards, and the second stress cushioning section and the third stress cushioning section are inclined obliquely downwards.

It can be seen that the conductive wire disclosed in some embodiments of the present disclosure is configured to connect two LED chips in a same electric connection region or is configured to connect two LED chips in different electric connection regions or one end of the conductive wire is connected with the LED chip in the electric connection region and the other end of the conductive wire is directly connected with the electric connection region (which is a same electric connection region where the LED chip is located or another electric connection region). Various conditions of the conductive wire will be described below in detail.

Embodiment 1

A conductive wire 2a of the embodiment is configured to connect an LED chip and an adjacent electric connection region, i.e., an LED chip 3a and a first electric connection region 11 in FIG. 6.

Referring to FIG. 4 to FIG. 10, the conductive wire 2a of the embodiment 1 is of a three-dimensional structure and includes a vertical section 21, a first stress cushioning section 22 inclined obliquely upwards, a second stress cushioning section 23 inclined obliquely downwards and a third stress cushioning section 24 inclined obliquely downwards that are sequentially arranged. A first transition bending section 25 is formed between the vertical section 21 and the first stress cushioning section 22, a second transition bending section 26 is formed between the first stress cushioning section 22 and the second stress cushioning section 23, and a third transition bending section 27 is formed between the second stress cushioning section 23 and the third stress cushioning section 24, namely the first transition bending section 25, the second transition bending section 26 and the third transition bending section 27 are sequentially arranged between two adjacent stress cushioning sections and between the vertical section and one stress cushioning section.

The first transition bending section 25, the second transition bending section 26 and the third transition bending section 27 are sequentially arranged along a length direction of the conductive wire 2a, namely, when the conductive wire 2a is projected on a horizontal plane, the second transition bending section 26 is between the first transition bending section 25 and the third transition bending section 27. In such case, the first stress cushioning section 22 is inclined towards the third stress cushioning section 24. Therefore, an inclination direction of the first stress cushioning section 22 is limited.

In addition, bending directions of the second transition bending section 26 and the third transition bending section 27 are opposite, namely an opening orientation of an included angle formed by the first stress cushioning section 22 and the second stress cushioning section 23 is opposite to an opening orientation of an included angle formed by the second stress cushioning section 23 and the third stress cushioning section 24. For example, in FIG. 6, an opening where the second transition bending section 26 is located is downward, and an opening where the third transition bending section 27 is upward (including oblique).

In the embodiment 1, the conductive wire 2a is configured to connect the first electric connection region 11 with the LED chip 3a. In such case, the vertical section 21 of the conductive wire 2a is connected with the LED chip 3a, and the third stress cushioning section 24 of the conductive wire 2a is connected with the first electric connection region 11. The first transition bending section 25, the second transition bending section 26 and the third transition bending section 27 are positioned on a same side of insulating regions 12. Two ends of the conductive wire 2a are usually connected with the corresponding parts in a welding connection manner.

In the embodiment 1, three transition bending sections of the conductive wire 2a are arranged on the same side of the insulating regions 12 (all are arranged in a second electric connection region 13), namely the first stress cushioning section 22 and the second stress cushioning section 23 are as close as possible to the vertical section 21. In such a manner, a stress cushioning capability of the conductive wire 2a is improved. When the first stress cushioning section 22 and the second stress cushioning section 23 are close to the vertical section 21, more portions of the first stress cushioning section 22 and the second stress cushioning section 23 are positioned over the LED chip 3a, and in such case, a smaller amount of packaging colloid is applied to a position where the first stress cushioning section 22 and the second stress cushioning section 23 are located, so that bad influence brought by thermal expansion and contraction of the packaging colloid is reduced, namely service life of the conductive wire 2a is prolonged.

For improving the stress cushioning capability of the conductive wire 2a of the embodiment 1, the first stress cushioning section 22 and the second stress cushioning section 23 are arranged over the LED chip 3a where the vertical section 21 is located in the embodiment 1. In such case, the packaging colloid below the first stress cushioning section 22 and the second stress cushioning section 23 is relatively thinnest. When the packaging colloid below the conductive wire 2a is thinner, the first stress cushioning section 22 and the second stress cushioning section 23 are subjected to a weaker thermal expansion stress, and the first stress cushioning section 22 and the second stress cushioning section 23 are relatively weak portions of the conductive wire 2a, so that the first stress cushioning section 22 and the second stress cushioning section 23 are disposed over the LED chip 3a in some embodiments of the present disclosure to improve the stress cushioning capability of the conductive wire 2a.

It is to be noted that bending of a gold wire is limited in the art known to inventors to ensure the service life of the gold wire. Considering this, in Chinese Patent Application CN106781242A, two bending points (a bending point between a vertical section and a first bent section and a bending point between the first bent section and a second bent section) are selected to be arranged on a conductive bonding wire for stress cushioning. However, it is found by a quick thermal shock test that, when a structure of the conductive wire 2a of the present disclosure is adopted, three bending points are arranged on the conductive wire 2a, but the overall service life of the LED device is not shortened but prolonged and the reliability of the LED device is also improved. The following table shows data related to the quick thermal shock test. The test is cyclically made under the condition of −65° C./15 min to 150° C./15 min at an interval of 0.5 h, and the condition is severer than that of an ordinary thermal shock test.

| Quick cooling shock test −65° C.-150° C./15 min (failure rate) | | | | | | | |
|---|---|---|---|---|---|---|---|
| Conductive wire mode | Camber height range (μm) | 80 cycle | 100 cycle | 120 cycle | 140 cycle | 160 cycle | 180 cycle |
| Q wire camber | 80-120 | 0/96 | 85/96 | — | — | — | — |
| C wire camber | 130-170 | 0/96 | 2/96 | 28/96 | 65/96 | — | — |
| J wire camber | 80-120 | 0/96 | 0/96 | 33/96 | 53/96 | — | — |
| J wire camber | 70-80 | 0/96 | 36/96 | 64/96 | — | — | — |
| CJ wire camber (the third transition bending section passes through the insulating region) | 60-80 | 0/96 | 0/96 | 0/96 | 38/96 | 54/96 | — |
| CJ wire camber (the third transition bending section does not pass through the insulating region) | 60-80 | 0/96 | 0/96 | 0/96 | 0/96 | 0/96 | 1/96 |

The Q wire camber and the C wire camber refer to planar wire cambers. The Q wire camber refers to a conventional two-dimensional wire camber in the art known to inventors, referring to the gold wire of Chinese Patent Application CN204204914U in the Background. The C wire camber refers to the gold wire disclosed in Chinese Patent Application CN204927345U. The J wire camber and the CJ wire camber refer to non-planar wire cambers. The J wire camber is specifically the conductive bonding wire disclosed in Chinese Patent Application CN106784242A, and the CJ wire camber is specifically the conductive wire 2a of the embodiment 1 in the present disclosure.

The following conclusions are reached from the table.

1: When the Q wire camber and the J wire camber have a same camber height (80 μm to 120 μm), a thermal shock resistance effect of the J wire camber is better than that of the Q wire camber. Under a same experimental condition, thermal shock resistance effects of the J wire camber and the CJ wire camber are better than those of the Q wire camber and the C wire camber. Thus it can be seen that performance of thermal shock resistance of a non-planar wire camber is higher than that of a planar wire camber, namely the J wire camber and the CJ wire camber are higher in reliability and longer in service life.

2: When a camber height of the J wire camber is 70 μm to 80 μm, the J wire camber fails when the thermal shock test is made for 100 times, and when the camber height of the J wire camber is 80 μm to 120 μm, the J wire camber fails when the thermal shock test is made for 120 times. Thus it can be seen that lower does not mean better for the J wire camber. The camber height of the J wire camber is optimally 80 μm to 120 μm. However, when the camber height is relatively great, the conductive wire is affected more by the packaging colloid, and the reliability of the LED device is reduced to a certain extent. This is just the shortcoming caused by the fact that it is difficult to reduce the camber height of the J wire camber.

When a camber height of the CJ wire camber is 60 μm to 80 μm, it fails when the thermal shock test is made for 180 times. Thus it can be seen that, when the camber height of the CJ wire camber is controlled to be relatively small, the reliability thereof is also relatively high. Therefore, when the CJ wire camber in the embodiment 1 of the present disclosure is adopted, the reliability thereof is higher than that of the other wire cambers.

3: In addition, it also is obtained through the test that service life when the third transition bending section does not pass through the insulating region is longer than service life when the third transition bending section passes through the insulating region.

For the conductive wire in the embodiment 1 of the present disclosure, a step that a welding head is pressed downwards is added based on the J wire camber, namely a new bending point is formed on the second bent section of the J wire camber. In such case, dependence of the camber height of the conductive wire on a J angle is reduced, a shorter first bent section is formed, the camber height in the embodiment 1 changes less than the J wire camber when the J angle changes, and it is ensured that the height of the vertical section is greater than a length of a HAZ of the wire at the same time of reducing the camber height.

In addition, the conductive wire of the embodiment 1 is also applied to connection of the LED chip and the electric connection region where the LED chip is located, namely one end of the conductive wire is connected with the LED chip in one electric connection region of the plurality of electric connection regions and the other end of the conductive wire is connected with the same electric connection region. Specific introductions are omitted herein and specifically refer to the above contents.

Embodiment 2

A conductive wire 2b of the embodiment 2 is configured to connect two LED chips (3a, 3b) in a second electric connection region 13. A structure of the conductive wire of the embodiment 2 is substantially the same as that in embodiment 1.

Referring to FIG. 6, the conductive wire 2b of the embodiment 2 is of a three-dimensional structure and includes a vertical section, a first stress cushioning section inclined obliquely upwards, a second stress cushioning section inclined obliquely downwards and a third stress cushioning section inclined obliquely downwards that are sequentially arranged. A first transition bending section is formed between the vertical section and the first stress cushioning section, a second transition bending section is formed between the first stress cushioning section and the second stress cushioning section, and a third transition bending section is formed between the second stress cushioning section and the third stress cushioning section, namely the first transition bending section, the second transition bending section and the third transition bending section are sequentially between the adjacent sections. The first transition bending section, the second transition bending section and the third transition bending section are sequentially arranged along a length direction of the conductive wire, and bending directions of the second transition bending section and the third transition bending section are opposite.

In the embodiment, the conductive wire 2b is configured to connect the two LED chips (3a, 3b) in a second electric connection region 13. The vertical section is connected with a positive electrode or negative electrode of one LED chip 3a, and the third stress cushioning section is connected with the other electrode of the other LED 3b, so that the two LED chips (3a, 3b) are electrically connected.

In addition, improving a stress cushioning capability of the conductive wire 2b of the embodiment 2, the first stress cushioning section and the second stress cushioning section are disposed over the LED chip 3a where the vertical section is located in the embodiment 2. In such case, a packaging colloid below the first stress cushioning section and the second stress cushioning section is relatively thinnest. When the packaging colloid below the conductive wire is thinner, the first stress cushioning section and the second stress cushioning section are subjected to a weaker thermal expansion stress, and the first stress cushioning section and the second stress cushioning section are relatively weak parts of the conductive wire, so that the first stress cushioning section and the second stress cushioning section are disposed over the LED chip in the embodiment 2.

Moreover, the conductive wire of the embodiment 2 is also applied to connection of two LED chips in different electric connection regions, namely one end of the conductive wire is connected with a certain LED chip in one electric connection region and the other end is connected with a certain LED chip in another electric connection region. Specific introductions are omitted herein and specifically refer to the above contents.

Embodiment 3

The conductive wires in embodiment 1 and embodiment 2 are further optimized in the embodiment 3, and each section of the conductive wire of the embodiment 3 is represented with the corresponding reference sign in embodiment 1. In both embodiment 1 and embodiment 2, the vertical section 21 is connected with the LED chip 3a. The vertical section 21 is connected with a positive electrode or negative electrode of the LED chip 3a in one electric connection region. When the LED chip 3a is a double-electrode chip and a vertical mounting manner is adopted for the double-electrode chip, the vertical section 21 is connected with one electrode in a positive electrode and negative electrode of the double-electrode chip, and the first stress cushioning section 22 is inclined towards the other electrode in the positive electrode and the negative electrode of the double-electrode chip. That is, a direction of the first stress cushioning section 22 is further limited to ensure that the relatively weak vertical section 21, first stress cushioning section 22 and second stress cushioning section 23 of the conductive wire (2a, 2b) are disposed over the LED chip 3a as much as possible. The vertical mounting manner for the double-electrode chip refers to that the two electrodes are arranged along an edge of the insulating region, and a connecting line of the two electrodes is parallel to the edge of the insulating region, i.e., arrangement shown in FIG. 6, and also forms a certain included angle with the edge of the insulating region.

In addition, in some embodiments of the present disclosure, the third stress cushioning section 24 and the vertical section 21 are on the same plane, which is more favorable for cushioning a stress on the conductive wire in a vertical direction.

Moreover, when there is a height difference between the two ends of the conductive wire 2a or when the conductive wire 2a is required to stride over the insulating region 12, the portion, connected with the bracket or the LED chip, of the third stress cushioning section of the conductive wire 2a is easily disconnected under the influence of upward and downward pulling stresses. For improving connection firmness of the conductive wire 2a, the conductive wire 2a of the embodiment 3 further includes a transition connecting section 28 disposed at a tail end of the third stress cushioning section 24. An included angle between the transition connecting section 28 and the horizontal plane is smaller than an included angle between the third stress cushioning section 24 and the horizontal plane, namely the transition connecting section 28 is almost horizontal. The end portion, far away from the third stress cushioning section 24, of the transition connecting section 28 is attached to a surface of the bracket 1 or the other LED chip, namely the transition connecting section 28 includes a straight section, at least a part of the straight section attaches to the surface of the bracket or the other LED chip, and in such case, even when the transition connecting section is subjected to an upward pulling force of the third stress cushioning section 24 or a stress in another direction, the pulling force is cushioned to a certain extent through the straight section and the pulling force is not directly transferred to the end portion of the conductive wire 2a, so that the connection firmness of the conductive wire 2a is enhanced. Of course, the third stress cushioning section 24 of the conductive wire 2a of the embodiment 3 is also electrically connected with the bracket or the LED chip directly.

The included angle between the transition connecting section and the horizontal plane is A0, $0°≤A0≤10°$.

It is to be noted that the camber heights of the conductive wires (2a, 2b) in the embodiment 3 of the present disclosure are reduced compared with the camber height of the conductive wire of the art known to inventors. The camber height in the art known to inventors is usually set to be 70 μm to 130 μm, while the camber heights of the conductive wires (2a, 2b) are controlled to be less than 70 μm after the conductive wires (2a, 2b) of the structure in the embodiment 3 of the present disclosed are adopted, namely a height difference between a highest point of the conductive wire (2a, 2b) and an upper surface of the LED chip 3a is H2, $50 \text{ μm}<H2≤70 \text{ μm}$, and correspondingly, a height of the vertical section 21 is H1, $30 \text{ μm}≤H1≤50 \text{ μm}$. Adopting the relatively small camber height in the embodiment 3 of the present disclosure reduces the influence of the thermal expansion stress of the packaging colloid on the conductive wires (2a, 2b).

In addition, it is proved by a plurality of tests that each parameter of the first stress cushioning section 22, the second stress cushioning section 23 and the third stress cushioning section 25 also greatly affects the service life of the conductive wire (2a, 2b). Preferred solutions of each section will be described below in combination with the drawings in detail.

(1) The first stress cushioning section 22: a length of a projection of the first stress cushioning section 22 on a horizontal plane is L1, $80 \text{ μm}≤L1≤120 \text{ μm}$; and an included angle between the first stress cushioning section 22 and the horizontal plane is A1, $0°<A2≤120°$.

(2) The second stress cushioning section 23: a length of a projection of the second stress cushioning section 23 on a horizontal plane is L2, $80 \text{ μm}≤L2≤120 \text{ μm}$;

an included angle between the second stress cushioning section 23 and the horizontal plane is A2, $0°<A2≤20°$; and a vertical height of the second stress cushioning section 23 is H3, $0 \text{ μm}<H3≤60 \text{ μm}$. H3 refers to a length of a projection of the second stress cushioning section on a vertical plane.

(3) Included angles between two cushioning sections: an included angle between projections of the first stress cushioning section 22 and the second stress cushioning section 23 on a horizontal plane is A3, $60°≤A3≤90°$; and an included angle between projections of the second stress cushioning section 23 and the third stress cushioning section 24 on a horizontal plane is A4, $120°≤A4≤135°$.

The third stress cushioning section 24 is related to a size and thickness of the LED chip, so that there is no corresponding solution, and the third stress cushioning section is limited according to a practical condition and each above-mentioned parameter.

In addition, the LED chip in the embodiment is a blue light chip, a red light chip or a green light chip and is selected as required. When a plurality of LED chips are disposed in the second electric connection region, the plurality of LED chips also select LED chips of different light as required.

As a solution of the LED chip and the packaging colloid, the LED chip is a blue light chip, and the packaging colloid is a mixture of fluorescent powder and organic silicon. The packaging colloid is a silicon resin, silica gel or an epoxy resin.

Embodiment 4

Correspondingly, the present disclosure also discloses an LED lamp, which includes the above mentioned LED device.

Embodiment 5

Correspondingly, the present disclosure also discloses a method for machining a conductive wire of an LED device, which includes the following steps. In A, after a gold ball is welded to a corresponding electrode of an LED chip in the at least one light-emitting diode chip, a welding head of the gold ball is moved upwards and a wire clamp is unreeled, thereby forming a vertical section.

In B, the welding head is moved along a set trajectory, thereby forming a bent section, the bent section including at least three stress cushioning sections that are sequentially arranged, a transition bending section being formed between the vertical section and a stress cushioning section disposed in sequence with the vertical section and a transition bending section being formed between any adjacent stress cushioning section in the at least three stress cushioning sections.

In the embodiment 5, the following steps are included.

In A, after the gold ball is welded to the corresponding electrode of the LED chip in the at least one light-emitting diode chip, the welding head is moved upwards and the wire clamp is unreeled, thereby forming the vertical section.

In B, the welding head is moved along the set trajectory, thereby forming a first bent section, the first bent section being a first stress cushioning section and a first transition bending section being formed between the first stress cushioning section and the vertical section. In this step, that the welding head is moved along the set trajectory refers to that the welding head runs along a route of the first stress cushioning section.

In C, the welding head is moved along the set trajectory, thereby forming a second bent section, a second transition bending section being formed between the second bent section and the first bent section, and in a process of forming the second bent section, the welding head is pressed downwards, thereby forming a third transition bending section, a second stress cushioning section and a third stress cushioning section being on two sides of the third transition bending section respectively. In this step, that the welding head is moved along the set trajectory refers to that the welding head moves obliquely downwards away from the first stress cushioning section from a tail end of the first stress cushioning section, and in this downward movement process, a downward pressing action is applied, thereby forming the third transition bending section.

For the conductive wire in the embodiment 5 of the present disclosure, the step that the welding head is pressed downwards is added based on a J wire camber, namely a new bending point is formed on the second bent section of the J wire camber. In such case, dependence of a camber height of the conductive wire on a J angle is reduced, a shorter first bent section is formed, the camber height in the present disclosure changes less than the J wire camber when the J angle changes, and it is ensured that a height of the vertical section is greater than a length of a HAZ of the wire at the same time of reducing the camber height.

The above is the preferred embodiment of the present disclosure. It is to be pointed out that those of ordinary skill in the art also make a number of improvements and embellishments without departing from the principle of the present disclosure and these improvements and embellishments shall also fall within the scope of protection of the present disclosure.

It is to be noted that terms used herein are only adopted to describe specific implementation modes and not intended to limit exemplary implementation modes according to the present disclosure. For example, singular forms, used herein, are also intended to include plural forms, unless otherwise clearly pointed out. In addition, it is also to be understood that terms "contain" and/or "include" used in the specification refer/refers to existence of features, steps, operations, apparatuses, components and/or combinations thereof.

Unless otherwise specified, relative arrangements of components and steps elaborated in these embodiments, numeric expressions and numeric values do not limit the scope of the present disclosure. Furthermore, it is to be understood that for ease of descriptions, the size of each part shown in the drawings is not drawn in accordance with an actual proportional relation. Technologies, methods and devices known by those of ordinary skill in the art are not be discussed in detail. However, where appropriate, the technologies, the methods and the devices shall be regarded as part of the authorized description. In all examples shown and discussed herein, any specific values shall be interpreted as only exemplar values instead of limited values. As a result, other examples of the exemplary embodiments have different values. It is to be noted that similar marks and letters represent similar items in the following drawings. As a result, once a certain item is defined in one drawing, it is unnecessary to further discus the certain item in the subsequent drawings.

In the descriptions of the present disclosure, it will be appreciated that locative or positional relations indicated by "front, back, up, down, left, and right", "horizontal, vertical, perpendicular, and horizontal", "top and bottom" and other terms are locative or positional relations shown on the basis of the drawings, which are only intended to make it convenient to describe the present disclosure and to simplify the descriptions without indicating or impliedly indicating that the referring device or element must have a specific location and must be constructed and operated with the specific location, and accordingly it cannot be understood as limitations to the present disclosure.

For ease of description, spatial relative terms such as "over", "above", "on an upper surface" and "upper" are used herein for describing a spatial position relation between a device or feature and other devices or features shown in the drawings. It will be appreciated that the spatial relative terms aim to contain different orientations in usage or operation besides the orientations of the devices described in the drawings. For example, if the devices in the drawings are inverted, devices described as "above other devices or structures" or "over other devices or structures" will be located as "below other devices or structures" or "under other devices or structures". Thus, an exemplar term "above" includes two orientations namely "above" and "below". The device is located in other different modes (rotated by 90 degrees or located in other orientations), and spatial relative descriptions used herein are correspondingly explained.

In addition, it is to be noted that terms "first", "second" and the like are used to limit parts, and are only intended to distinguish corresponding parts.

It is to be noted that terms used herein are only adopted to describe specific implementation modes and not intended to limit exemplary implementation modes according to the present application. For example, singular forms, used herein, are also intended to include plural forms, unless otherwise clearly pointed out. In addition, it is also to be understood that terms "contain" and/or "include" used in the specification refer/refers to existence of features, steps, work, apparatuses, components and/or combinations thereof.

It is to be noted that terms "first", "second" and the like in the specification, claims and drawings of the present application are adopted not to describe a specific sequence or order but to distinguish similar objects. It is to be understood that data used like this may be exchanged under a proper condition for implementation of the implementation modes, described herein, of the present application in sequences besides those shown or described here.

The above is only some embodiments of the present disclosure and not intended to limit the present disclosure. For those skilled in the art, the present disclosure has various modifications and variations. Any modifications, equivalent replacements, improvements and the like made within the spirit and principle of the present disclosure shall fall within the scope of protection of the present disclosure.

What is claimed is:

1. A light-emitting diode device, comprising at least one light-emitting diode chip, a bracket configured to the at least one light-emitting diode chip and at least one conductive wire electrically connected with the at least one light-emitting diode chip, wherein each of the at least one conductive wire is of a three-dimensional structure and includes a vertical section and bent section that are sequentially arranged, the bent section comprises at least three stress cushioning sections that are sequentially arranged, transition bending sections are formed between adjacent stress cushioning sections in the at least three stress cushioning sections, and bending directions of adjacent transition bending sections in the transition bending sections are opposite; and one end of the each of the at least one conductive wire is configured to connect one light-emitting diode chip of the at least one light-emitting diode chip, and the other end of the each of the at least one conductive wire is configured to connect the bracket or another light-emitting diode chip of the at least one light-emitting diode chip;

wherein the bent section comprises third stress cushioning section that is disposed at an end of a corresponding conductive wire of the at least one conductive wire;

the each of the at least one conductive wire further comprises a transition connecting section disposed at a tail end of the third stress cushioning section, an included angle between the transition connecting section and a horizontal plane is smaller than an included angle between the third stress cushioning section and a horizontal plane, and an end portion, far away from the third stress cushioning section, of the transition connecting section is attached to a surface of the bracket or a surface of the another light-emitting diode chip.

2. The light-emitting diode device as claimed in claim 1, wherein the bracket comprises a plurality of electric connection regions, any two adjacent electric connection regions in the plurality of electric connection regions are spaced through an insulating region, the at least one light-emitting diode chip is disposed in the plurality of electric connection regions, the vertical section of the each of the at least one conductive wire is electrically connected with an light-emitting diode chip of the at least one light-emitting diode chip in one electric connection region of the plurality of electric connection regions, and one end, opposite to the vertical section, of the each of the at least one conductive wire is electrically connected with another light-emitting diode chip of the at least one light-emitting diode chip in a same electric connection region, an light-emitting diode chip of the at least one light-emitting diode chip in an adjacent electric connection region, a same electric connection region or an adjacent electric connection region.

3. The light-emitting diode device as claimed in claim 1, wherein the bent section comprises a first stress cushioning section and second stress cushioning section that are sequentially arranged, a first transition bending section is formed between the vertical section and the first stress cushioning section, a second transition bending section is formed between the first stress cushioning section and the second stress cushioning section, a third transition bending section is formed between the second stress cushioning section and the third stress cushioning section, and the first transition bending section, the second transition bending section and the third transition bending section are sequentially disposed along a length direction of a corresponding conductive wire of the at least one conductive wire.

4. The light-emitting diode device as claimed in claim 3, wherein the first transition bending section, the second transition bending section and the third transition bending section are positioned on a same side of an insulating region.

5. The light-emitting diode device as claimed in claim 3, wherein the first stress cushioning section and the second stress cushioning section are positioned over the light-emitting diode chip where the vertical section is located.

6. The light-emitting diode device as claimed in claim 3, wherein the vertical section is electrically connected with the light-emitting diode chip of the at least one light-emitting diode chip, the light-emitting diode chip is a double-electrode chip, and when a vertical mounting manner is adopted for the double-electrode chip, the vertical section is connected with one electrode in a positive electrode and a negative electrode of the double-electrode chip and the first stress cushioning section is inclined towards the other electrode in the positive electrode and the negative electrode of the double-electrode chip.

7. The light-emitting diode device as claimed in claim 3, wherein the first stress cushioning section is inclined obliquely upwards, and the second stress cushioning section and the third stress cushioning section are inclined obliquely downwards.

8. The light-emitting diode device as claimed in claim 3, wherein the third stress cushioning section and the vertical section are positioned on a same plane.

9. The light-emitting diode device as claimed in claim 1, wherein the included angle between the transition connecting section and the horizontal plane is A0, $0°\leq A0\leq 10°$.

10. The light-emitting diode device as claimed in claim 1, wherein a height of the vertical section is H1, $30\ \mu m\leq H1\leq 50\ \mu m$, and a height difference between a highest point of the each of the at least one conductive wire and an upper surface of the light-emitting diode chip connected with one end of the each of the at least one conductive wire is H2, $50\ \mu m<H2\leq 70\ \mu m$.

11. The light-emitting diode device as claimed in claim 3, wherein a length of a projection of the first stress cushioning section on a horizontal plane is L1, $80\ \mu m\leq L1\leq 120\ \mu m$, and an included angle between the first stress cushioning section and the horizontal plane is A1, $0°<A1\leq 20°$.

12. The light-emitting diode device as claimed in claim 3, wherein a length of a projection of the second stress cushioning section on a horizontal plane is L2, $80\ \mu m\leq L2\leq 120\ \mu m$, an included angle between the second stress cushioning section and a horizontal plane is A2, $0°<A2\leq 20°$, and a vertical height of the second stress cushioning section is H3, $0\ \mu m<H3\leq 60\ \mu m$.

13. The light-emitting diode device as claimed in claim 3, wherein an included angle between projections of the first stress cushioning section and the second stress cushioning section on a horizontal plane is A3, $60°\leq A3\leq 90°$, and an included angle between projections of the second stress cushioning section and the third stress cushioning section on a horizontal plane is A4, $120°\leq A4\leq 135°$.

14. A light-emitting diode lamp, comprising the light-emitting diode device as claimed in claim 1.

15. A method for machining a conductive wire of the light-emitting diode device as claimed in claim 3, comprising the following steps:

A, after a gold ball is welded to a corresponding electrode of an light-emitting diode chip in the at least one light-emitting diode chip, moving a welding head of the gold ball upwards and unreeling a wire clamp, thereby forming a vertical section;

B, moving the welding head along a set trajectory, thereby forming a first bent section, the first bent section being a first stress cushioning section and a first transition bending section being formed between the first stress cushioning section and the vertical section; and C, moving the welding head along the set trajectory, thereby forming a second bent section, a second transition bending section being formed between the second bent section and the first bent section, and in a process of forming the second bent section, pressing the welding head downwards, thereby forming a third transition bending section, a second stress cushioning section and a third stress cushioning section being on two sides of the third transition bending section respectively.

\* \* \* \* \*